(12) United States Patent
Asenov (10) Patent No.: US 9,263,568 B2
(45) Date of Patent: Feb. 16, 2016

(54) FLUCTUATION RESISTANT LOW ACCESS RESISTANCE FULLY DEPLETED SOI TRANSISTOR WITH IMPROVED CHANNEL THICKNESS CONTROL AND REDUCED ACCESS RESISTANCE

(71) Applicant: Gold Standard Simulations Ltd., Glasgow, Scotland (GB)

(72) Inventor: Asen Asenov, Glasgow (GB)

(73) Assignee: SemiWise Limited, Glasgow, Scotland (GB)

( * ) Notice: Subject to any disclaimer, the term of this patent is extended or adjusted under 35 U.S.C. 154(b) by 0 days.

(21) Appl. No.: 13/950,810

(22) Filed: Jul. 25, 2013

(65) Prior Publication Data

US 2014/0027853 A1 Jan. 30, 2014

Related U.S. Application Data (60) Provisional application No. 61/676,932, filed on Jul. 28, 2012.

(51) Int. Cl.
| | |
|---|---|
| *H01L 21/02* | (2006.01) |
| *H01L 29/78* | (2006.01) |
| *H01L 29/66* | (2006.01) |

(Continued)

(52) U.S. Cl.
CPC ............ *H01L 29/78* (2013.01); *H01L 29/1041* (2013.01); *H01L 29/4983* (2013.01); *H01L 29/66477* (2013.01); *H01L 29/66545* (2013.01);

(Continued)

(58) Field of Classification Search
CPC .......................... H01L 29/66492; H01L 29/78
USPC .......................................................... 257/330
See application file for complete search history.

(56) References Cited

U.S. PATENT DOCUMENTS

| | | | |
|---|---|---|---|
| 5,298,452 | A | 3/1994 | Meyerson |
| 5,314,547 | A | 5/1994 | Heremans et al. |

(Continued)

FOREIGN PATENT DOCUMENTS

| | | |
|---|---|---|
| EP | 0936676 | 8/1999 |
| WO | WO-2009/053327 | 4/2009 |
| WO | WO-2013/027092 | 2/2013 |

OTHER PUBLICATIONS

"International Search Report and Written Opinion of the International Searching Authority Dated Nov. 9, 2012, International Application No. PCT/IB2012/001068".

(Continued)

*Primary Examiner* — Ajay K Arora
(74) *Attorney, Agent, or Firm* — Blakely Sokoloff Taylor & Zafman LLP (57) ABSTRACT

The structure, and fabrication method thereof, implements a fully depleted silicon-on-insulator (SOI) transistor using a "Channel Last" procedure in which the active channel is a low-temperature epitaxial layer in an etched recess in the SOI silicon film. An optional δ-layer of extremely high doping allows its threshold voltage to be set to a desired value. Based on high-K metal gate last technology, this transistor has reduced threshold uncertainty and superior source and drain conductance. The use of epitaxial layer improves the thickness control of the active channel and reduces the process induced variations. The utilization of active silicon layer that is two or more times thicker than those used in conventional fully depleted SOI devices, reduces the access resistance and improves the on-current of the SOI transistor.

17 Claims, 7 Drawing Sheets

(51) Int. Cl.
    *H01L 29/49* (2006.01)
    *H01L 29/10* (2006.01)
(52) U.S. Cl.
    CPC .... *H01L 29/66621* (2013.01); *H01L 29/66651* (2013.01); *H01L 29/7833* (2013.01)

(56) References Cited

U.S. PATENT DOCUMENTS

| | | | |
|---|---|---|---|
| 5,316,958 A | 5/1994 | Meyerson | |
| 6,180,978 B1 | 1/2001 | Chatterjee et al. | |
| 6,479,866 B1 | 11/2002 | Xiang | |
| 6,566,734 B2 | 5/2003 | Sugihara et al. | |
| 6,627,488 B2 | 9/2003 | Lee | |
| 6,630,710 B1 | 10/2003 | Augusto | |
| 6,667,200 B2 | 12/2003 | Sohn et al. | |
| 6,746,924 B1 | 6/2004 | Lee et al. | |
| 6,812,157 B1 | 11/2004 | Gadgil | |
| 7,023,068 B1 | 4/2006 | Hopper et al. | |
| 7,045,407 B2 | 5/2006 | Keating et al. | |
| 7,459,752 B2 | 12/2008 | Doris et al. | |
| 7,589,347 B2 | 9/2009 | Nash et al. | |
| 7,906,413 B2 | 3/2011 | Cardone et al. | |
| 8,273,617 B2 | 9/2012 | Thompson et al. | |
| 8,748,986 B1 * | 6/2014 | Shifren et al. | 257/348 |
| 2001/0009292 A1 | 7/2001 | Nishinohara et al. | |
| 2002/0001930 A1 | 1/2002 | Lee | |
| 2002/0029372 A1 | 3/2002 | Lee | |
| 2002/0037619 A1 | 3/2002 | Sugihara et al. | |
| 2003/0211681 A1 | 11/2003 | Hanafi et al. | |
| 2004/0201063 A1 | 10/2004 | Fukuda | |
| 2004/0206980 A1 | 10/2004 | Cheong et al. | |
| 2006/0022270 A1 | 2/2006 | Boyd et al. | |
| 2006/0046399 A1 | 3/2006 | Lindert et al. | |
| 2006/0113605 A1 | 6/2006 | Currie | |
| 2008/0001237 A1 | 1/2008 | Chang et al. | |
| 2008/0017887 A1 | 1/2008 | Nagata et al. | |
| 2009/0321820 A1 | 12/2009 | Yamakawa | |
| 2009/0321849 A1 | 12/2009 | Miyamura et al. | |
| 2010/0237433 A1 | 9/2010 | Zampardi et al. | |
| 2011/0073961 A1 | 3/2011 | Dennard et al. | |
| 2011/0074498 A1 | 3/2011 | Thompson et al. | |
| 2011/0212583 A1 | 9/2011 | Neudeck | |
| 2011/0260220 A1 | 10/2011 | Chi et al. | |
| 2013/0001706 A1 | 1/2013 | Haran et al. | |

OTHER PUBLICATIONS

"International Search Report and Written Opinion of the International Searching Authority Dated Nov. 9, 2012, International Application No. PCT/IB2012/001069", (Nov. 9, 2012).
"International Search Report and Written Opinion of the International Searching Authority Dated Nov. 13, 2013, International Application No. PCT/IB2013/001637", (Nov. 13, 2013).
"Office Action Dated Aug. 13, 2013; U.S. Appl. No. 13/424,745", (Aug. 13, 2013).
"Office Action Dated Nov. 22, 2013; U.S. Appl. No. 13/424,727", (Nov. 22, 2013).
"Office Action Dated Oct. 24, 2013; U.S. Appl. No. 13/424,745", (Oct. 24, 2013).
Asenov, Asen, "Random Dopant Threshold Voltage Fluctuations in 50nm Epitaxial Channel MOSFETs: A 3D 'Atomistic' Simulation Study", *ESSDERC '98: 28th Conference on European Solid-State Devices*, Bordeax, France, (Sep. 8-10, 1998), pp. 300-303.
Asenov, Asen, et al., "Suppression of Random Dopant-Induced Threshold Voltage Fluctuations in Sub-01-μm MOSFET's with Epitaxial and δ-Doped Channels", *IEEE Transactions on Electron Devices*, vol. 46, No. 8, (Aug. 1999), pp. 1718-1724.
Bruel, M., "Silicon on insulator material technology", *Electronics Letters*, vol. 31, No. 14, (Jul. 6, 1995), pp. 1201-1202.
Colinge, Jean-Pierre, "Hot-Electron Effects in Silicon-On-Insulator n-Channel MOSFET's", *IEEE Transactions on Electron Devices*, vol. ED-34, No. 10, (Oct. 1987), pp. 2173-2177.
Courtland, Rachel, "Start-up Seeks New Life for Planar Transistors, SuVolta is pursuing precision doping in its bid to compete with 3-D transistor technology", *ieee spectrum tech alert*, (Dec. 8, 2011), 3 pp. total.
Frank, Martin M., "High-k / Metal Gate Innovations Enabling Continued CMOS Scaling", *2011 Proceedings of the ESSCIRC*, (Sep. 12-16, 2011), pp. 50-58.
Fu, Y., et al., "Subband structure and ionized impurity scattering of the two dimensional electron gas in δdoped field effect transistor", *Journal of Applied Physics*, vol. 78, No. 5, (Sep. 1, 1995), pp. 3504-3510.
Fujita, K., et al., "Advanced Channel Engineering Achieving Aggressive Reduction of $V_T$ Variation for Ultra-Low-Power Applications", *Electron Devices Meeting (IEDM), 2011 IEEE International*, (Dec. 2011), pp. 32.3.1-32.3.4.
Hokazono, Akira, et al., "25-nm Gate Length nMOSFET With Steep Channel Profiles Utilizing Carbon-Doped Silicon Layers (A P-Type Dopant Confinement Layer)", *IEEE transactions on Electron Devices*, vol. 58, No. 5, (May 2011), pp. 1302-1310.
Kuhn, Kelin J., et al., "Process Technology Variation", *IEEE Transactions on Election Devices*, vol. 58, No. 8, (Aug. 2011), pp. 2197-2208.
Maleville, Christophe, "Extending planar device roadmap beyond node 20nm through ultra thin body technology", *2011 International Symposium on VLSI Technology, Systems Applications (VLSI-TSA)*, (Apr. 25-27, 2011), pp. 1-4.
Markov, Stanislov, et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.
Meyer, J. E., et al., "High Performance, Low Power CMOS Memories Using Silicon-On-Sapphire Technology", *1971 International Electron Devices Meeting*, (1971), p. 44.
Noda, Kenji, et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.
Pawlak, B. J., et al., "Effect of amorphization and carbon co-doping on activation and diffusion of boron in silicon", *Applied Physics Letters*, 89, 062110, (2006), pp. 062110-1 to 062110-3.
Pawlak, B. J., et al., "Suppression of phosphorus diffusion by carbon co-implantation", *Applied Physics Letters*, 89, 062102, (2006), pp. 062102-1 to 062102-3.
Roy, G., et al., "Random dopant fluctuation resistant 'bulk' MOSFETs with epitaxial delta doped channels", *Ultimate Integration in Silicon (ULIS) Conference*, Glasgow, Scotland, (2007), 4 pp. total.
Takeuchi, Kiyoshi, et al., "Channel Engineering for the Reduction of Random-Dopant-Placement-Induced Threshold Voltage Fluctuation", *1997 International Electron Devices Meeting (IEDM), Technical Digest*, (Dec. 7-10, 1997), pp. 841-844.
"Office Action Dated May 7, 2014; U.S. Appl. No. 13/424,727".
"Office Action Dated Jul. 7, 2014; U.S. Appl. No. 13/424,745".
"Office Action Dated Jul. 7, 2014; U.S. Appl. No. 13/950,834".
"Office Action Dated Jul. 8, 2014; U.S. Appl. No. 13/950,868".
Asenov, Asen, "Random Dopant Induced Threshold Voltage Lowering and Fluctuations in Sub-0.1 μm MOSFET's: A 3-D "Atomistic" Simulation Study", *IEEE Transactions on Electron Devices*, vol. 45, No. 12, (Dec. 1998), pp. 2505-2513.
"Notice of Allowance Dated Dec. 19, 2014; U.S. Appl. No. 14/323,177".
"Notice of Allowance Dated Nov. 14, 2014; U.S. Appl. No. 13/424,727".
"Office Action Dated Oct. 24, 2014; U.S. Appl. No. 13/950,868".
"Office Action Dated Oct. 27, 2014; U.S. Appl. No. 13/950,834".
Saraswat, Krishna C., "Shallow Junctions", downloaded from http://web.stanford.edu/class/ee311/Notes/ShallowJunctions.pdf, (Apr. 10, 2006), pp. 1-20.
"Office Action Dated Aug. 25, 2015; U.S. Appl. No. 13/424,745".
"Office Action Dated Jul. 1, 2015; U.S. Appl. No. 13/950,868".
"Office Action Dated May 8, 2015; U.S. Appl. No. 14/664,595".
"Notice of Allowance Dated Jul. 7, 2015; U.S. Appl. No. 13/950,834".

* cited by examiner

FLUCTUATION RESISTANT LOW ACCESS RESISTANCE FULLY DEPLETED SOI TRANSISTOR WITH IMPROVED CHANNEL THICKNESS CONTROL AND REDUCED ACCESS RESISTANCE

CROSS-REFERENCE TO RELATED APPLICATIONS

This application claims the benefit of U.S. Provisional Patent Application No. 61/676,932 filed Jul. 28, 2012.

BACKGROUND OF THE INVENTION

1. Field of the Invention

The invention generally relates to the manufacturing of metal-oxide-semiconductor field effect transistors (MOSFETs), and more particularly to transistors fabricated in thin silicon films over an insulating layer, usually referred to as "buried oxide" or BOX. Even more specifically, this invention deals with those instances where random variations of the threshold voltages of MOSFETs adversely affect integrated circuit yield and performance.

2. Prior Art

MOS transistors have long been troubled by the adverse effects of their underlying substrates, like parasitic capacitance and area-consuming isolation. In the earliest days of integrated circuit (IC) technology, the use of a thin film of silicon on a sapphire substrate was proposed as a solution to these problems. RCA Laboratories was an early proponent of this technology, as in Meyer, J. E.; Boleky, E. J.; "High performance, low power CMOS memories using silicon-on-sapphire technology," Electron Devices Meeting, 1971 International, vol. 17, p. 44, 1971. The basic ideas of this technology have evolved over the years, driven by improvements in materials technology, and as less exotic substrates became practical, this technology became known as silicon-on-insulator (SOI). In the earliest implementations, the silicon was simply a relatively thin, less than 1 micron thick, substrate with a conventional level of doping and a depletion layer beneath the transistor's gate. This depletion layer is thinner than the silicon thickness, resulting in 'partially depleted' SOI (PD SOI). The un-depleted doped region beneath the gate of a PD SOI transistor proved to have its own disadvantages, largely caused by its tendency to charge and discharge resulting in step changes in the drain current. These problems became known as a "kink" effect, and it was closely tied to impact ionization in the transistor's channel and electron/hole trapping in the un-depleted part of the silicon under the channel.

The next stage in SOI evolution was the use of a fully-depleted silicon film (FDSOI). This was achieved by making the silicon beneath the gate so thin that there would be no region where there could be mobile carriers. Some of the early work was done at HP Laboratories and reported as Colinge, J.-P.; "Hot-electron effects in Silicon-on-insulator n-channel MOSFET's," Electron Devices, IEEE Transactions on, vol. 34, no. 10, pp. 2173-2177, October 1987. In this work, the silicon film is thinner by a factor of 10, i.e., only 100 nm thick.

The next step in fully depleted SOI technology has been prompted by the emergence of threshold voltage variations that are associated with the uncertainty of the number of discrete doping ions immediately beneath the gate. This uncertainty is similar to shot noise, because it is an irreducible, statistical uncertainty. For large devices, the counting uncertainty, roughly proportional to the square root of the total number of ions, was never a problem. However, in a world where devices have dimensions of the order of 30 nm, the total number of doping ions drops below 100, and the counting uncertainty is about 3%, rising to 10% for smaller devices. These deviations are devastating when billions of transistors are integrated into a single integrated circuit chip. The immediate solution required eliminating all doping from the silicon layer, placing all the responsibility for threshold control on the relative work functions of the gate material, now a metal, and the thickness of the silicon film. This has been done with both planar and FinFET transistor structures. A good review of this work may be found in Kuhn, K. J.; Giles, M. D.; Becher, D.; Kolar, P.; Kornfeld, A.; Kotlyar, R.; Ma, S. T.; Maheshwari, A.; Mudanai, S.; "Process Technology Variation," Electron Devices, IEEE Transactions on, vol. 58, no. 8, pp. 2197-2208, August 2011.

Planar transistors at 32/28 nm CMOS technology generation manufactured to have good electrostatic integrity and resistance to doping fluctuations must employ extremely thin silicon layers, of the order of 7 nm, and they are fabricated over thin buried oxide layers, roughly 10 nm thick. This is discussed in detail in Maleville, C.; "Extending planar device roadmap beyond node 20 nm through ultra thin body technology," VLSI Technology, Systems and Applications (VLSI-TSA), 2011 International Symposium on, pp. 1-4, 25-27 Apr. 2011. Layers in the sub-10 nm thickness range present manufacturing challenges, and the very thin layers have an adverse effect on performance because the parasitic series resistance in sources and drains cuts down on the transistors' gain figures. The limited number of dopants, particularly in the access regions below the spacer also introduce variability to access resistance and on-current, as published by S. Markov, S; Cheng, B.; Asenov, A.; "Statistical variability in fully depleted SOI MOSFETs due to random dopant fluctuations in the source and drain extensions," IEEE Electron Dev. Let. Vol. 33, pp. 315-317 (March, 2012).

There have been a variety of publications that address the use of an undoped or lightly doped epitaxial channel region to mitigate the fluctuations associated with random doping variations. The publications include Takeuchi, K.; Tatsumi, T.; Furukawa, A.; "Channel engineering for the reduction of random-dopant-placement-induced threshold voltage fluctuation," Electron Devices Meeting, 1997. IEDM '97. Technical Digest., International, pp. 841-844, 7-10 Dec. 1997; Asenov, A.; Saini, S.; "Suppression of random dopant-induced threshold voltage fluctuations in sub-0.1-µm MOSFET's with epitaxial and δ-doped channels," Electron Devices, IEEE Transactions on, vol. 46, no. 8, pp. 1718-1724, August 1999; and Thompson; Scott E.; Thummalapally; Damodar R.; "Electronic Devices and Systems, and Methods for Making and Using the Same," U.S. Patent Application 2011/0074498, Mar. 31, 2011. All these publications address the use of epitaxy in the channels of bulk transistors.

Figure 1:
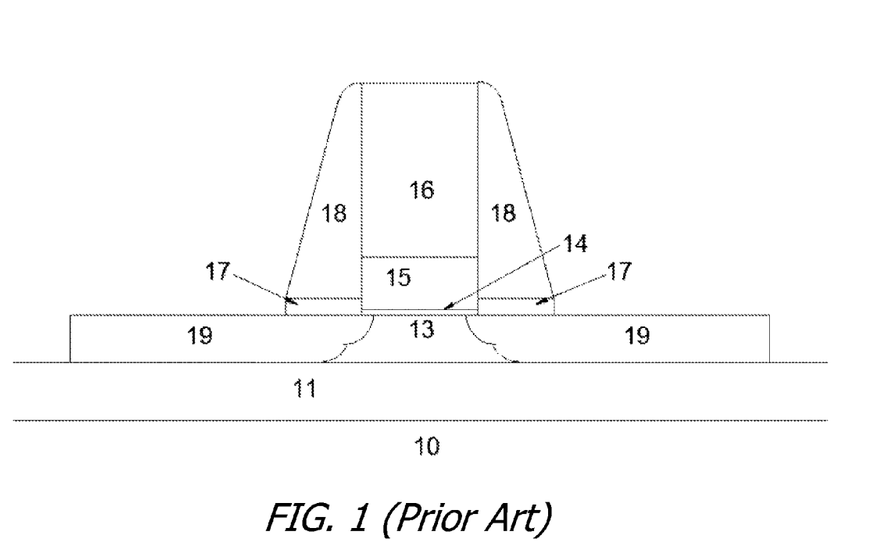
FIG. 1 is a schematic cross section of a prior art fully depleted SOI transistor.

FIG. 1 shows a schematic representation of conventional, fully-depleted SOI transistor. The transistor in FIG. 1 is fabricated on a substrate 10, with a buried oxide 11 separating all components of the transistor from the underlying substrate 10. The active region 13 is intentionally undoped or doped at a low level of $10^{15}$-$10^{17}$/cm$^3$ that permits the active region to be totally free of carriers when there is no applied voltage difference between the gate 15 and 16 and the source, one of either region marked 19. This is made possible because a metal gate 15 is chosen to have a work function which establishes the appropriate electrostatic potentials within the silicon channel region 13. The gate region 16 is a robust material like polycrystalline silicon that permits fabrication of further structures like inter-layer dielectrics and contacts. Normally in the fabrication of the transistor shown in FIG. 1, there is a protective oxide 17 which is removed and replaced by a thin, high dielectric constant stack identified as 14. On each side of the gate structure comprising elements 14, 15 and 16, there is a spacer 18. Typically, this spacer is a robust dielectric like silicon nitride that has been etched anisotropically to leave walls of finite thickness on each side of the gate structure. Because of the limitations in FDSOI transistors, the total thickness of region 13 and that part of region 19 that lies beneath the spacer is the same, 4 nm to 8 nm in advanced technologies. The transistor described in FIG. 1 suffers from the limitations described hereinabove.

While the use of prior art FDSOI structures eliminates threshold voltage variations associated with random doping fluctuations, that advantage vanishes when doping is used to adjust threshold voltages. Further, the prior art structure remains subject to variations associated with the randomness of the drain-channel interface, and its source and drain conductances are limited by the very thin film thickness.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

The structure, and fabrication method thereof, implements a fully depleted silicon-on-insulator (SOI) transistor using a "Channel Last" procedure in which the active channel is a low-temperature epitaxial layer in an etched recess in the SOI silicon film. An optional δ-layer of extremely high doping allows its threshold voltage to be set to a desired value. Based on high-K metal gate last technology, this transistor has reduced threshold uncertainty and superior source and drain conductance. The use of epitaxial layer improves the thickness control of the active channel and reduces the process induced variations. The utilization of active silicon layer that is two or more times thicker than those used in conventional fully depleted SOI devices, reduces the access resistance and improves the on-current of the SOI transistor.

Embodiments of the invention achieve extremely low random variability in fully depleted SOI transistors by modifying the transistor structure to substantially reduce the variations associated with random doping fluctuations and allow the use of thicker starting silicon films. The use of thicker silicon film also results in reduction of the access resistance and an increase in the drive current. Further, this invention addresses a second source of fluctuations, variability associated with the uncertainty of the location of the PN junctions that separate sources and drains from the bodies of their respective transistors. This is achieved creating fully-depleted SOI transistors using a "channel last" process. This process and its resulting structure present several advantages, including reduced threshold variations, use of thicker silicon films, improved access resistance, and process means for defining a variety of threshold voltages.

The new structure differs from the prior art, described for example in FIG. 1 in the physical and electrical structure of the channel region of the thin-film, SOI transistor. This is illustrated in the exemplary and non-limiting FIG. 2. As in prior art, the transistor is supported by a substrate 20 and a buried oxide 21. Instead of a single channel region, this transistor has a compound channel region made up of an epitaxial region 231, which is very lightly doped, i.e., less than $10^{17}$ doping ions/cm$^3$ and preferably less than $10^{16}$ doping ions/cm$^3$. At the top of the lightly doped epitaxial region, there is a high-K gate stack 24. Beneath the epitaxial region there is a δ-layer 22, extremely thin, which is doped with acceptors for NMOS and donors for PMOS. The lateral extent of the channel region 231 and the δ-layer 22 along an axis passing between the source/drain electrodes 29 is essentially identical to the span between the spacers 28. According to an embodiment the thickness of layer 231 should be half or less of the thickness of layer 29. The transistor is completed by a metallic gate with controlled work function 25 and a robust gate handle 26, typically amorphous or polycrystalline silicon. Regions 27 are residual patches of protective oxide from early stages of the process.

Figure 2:
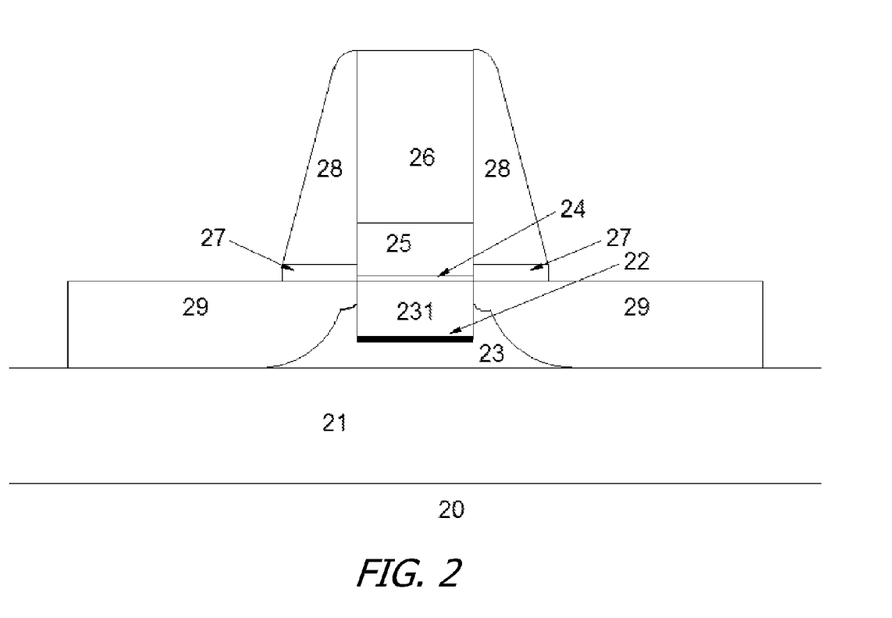
FIG. 2 is a schematic cross section of a transistor reflecting the structural improvements in this invention.

The role of the δ-layer 22 is to screen the lateral penetration of the drain field in the channel, reducing the short channel effects despite the increased thickness of the channel region. The δ-layer 22 also provides electrostatic control of the threshold voltage. The S-layer 22 has a thickness of 1-3 nm, representing a few atomic layers. A typical doping density for the δ-layer 22 is $1\times10^{13}$ ions per cm$^2$. That means that for every 500 silicon atoms in that δ-layer there is one active doping atom. For an NMOS transistor the dopants are acceptor ions, like boron or indium. For a PMOS transistor the dopants in δ-layer 22 are donors like phosphorus, arsenic or antimony. Further, because δ-layer 22 is so thin, in normal operation conditions those dopants are always fully ionized, and there are no mobile charges in the δ-layer 22. By adjusting the doping density in δ-layer 22, it is possible to tune the threshold voltage to a higher or lower value, so the doping density cited above can vary from essentially zero to around $5\times10^{13}$ ions/cm$^2$. Expressed as volume doping densities, the range would go up to $5\times10^{20}$ ions/cm$^3$, with $1\times10^{20}$ being a more typical number. In order to realize the full benefits of this structure, it is important to build the device so the boundary between δ-layer 22 with its high doping is steep enough to retain the sharply localized character of that thin layer.

A typical thickness for the undoped epi region 231 is in the range from 5 nm to 15 nm. Adjacent to region 231 is the gate dielectric 24, and for this class of transistor, that dielectric is expected to be a high-K dielectric stack. While silicon dioxide has a dielectric constant K of 3.9, a high-K dielectric stack has an effective dielectric constant of 6 or more. Oxides or oxynitrides of hafnium are typical constituents of the high-K stack, along with thin transition layers to minimize surface states. On top of the gate dielectric, there is a metallic gate 25, and its composition is chosen for both its manufacturability and its work function. While TiN is a frequent choice, many other metals, alloys and metallic compounds can be used.

The gate structure is completed by a gate "handle" 26, which provides both electric contact and physical protection for the underlying metal gate 25. The gate handle 26 is typically formed from amorphous or polycrystalline silicon. The transistor structure is completed with sources and drains 29, which are heavily doped regions providing current paths to the active channel that can be induced in region 23 near the gate dielectric 24. There are a variety of approaches to forming the source and drain regions, like simple heavy doping with arsenic or phosphorus for NMOS, boron or indium for PMOS. Other approaches include adding epitaxial silicon or silicon-germanium to enhance the conductivity of the sources and drains 29 by making them thicker. The epitaxial germanium also inserts compressive strain and increases the performance of the p-channel transistors. Also, the sources and drains 29 may have their conductance enhanced by the addition of a layer of metal silicide, nickel silicide being frequently used.

One way to realize the structure in FIG. 2 is by a "Channel Last" process sequence. This is illustrated in the exemplary and non-limiting sequence of FIGS. 3A through 3L, which are a sequence of schematic cross sections having the same orientation as that of FIG. 2. The method illustrated in FIGS. 3A through 3L are intended to realize the improved transistor structure described hereinabove.

Figure 3A:
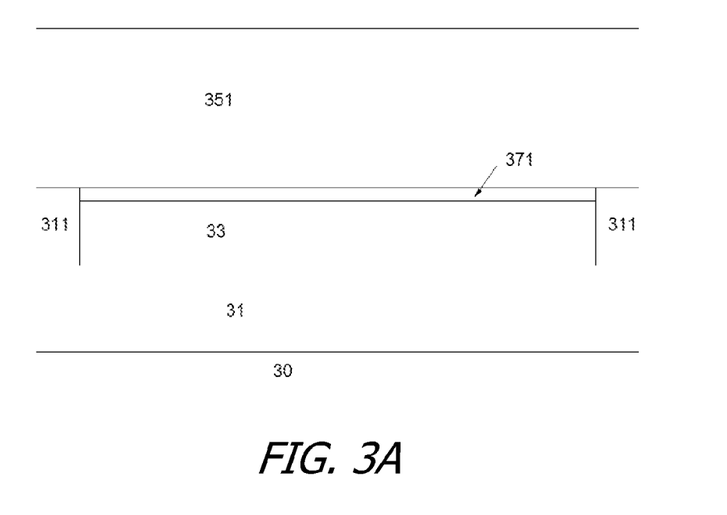
FIGS. 3A through 3L are a schematic cross sections of a processing sequence by which the "Channel Last" structure is manufactured using channel ion implantation.

FIG. 3A shows a substrate 30, and above that there is a buried oxide 31. Region 33 is single crystal silicon, typically between 10 nm and 30 nm thick, and in an embodiment of the invention is at least twice as thick as layer 31. For the purposes of the ongoing illustration, it will be assumed, without limiting the scope of the invention, to be 15 nm thick. (It should be noted that in conventional FDSOI this layer would be much thinner; for example for a 22 nm technology, the thickness would be 5 to 6 nm.) Ultimately, the extra thickness can be used to enhance the source and drain conductance. The silicon region 33 is defined in its extents by isolation 311. The boundaries between silicon 33 and isolation 311, as shown in FIG. 3A, define the overall length of silicon required for the transistor, which comprises a source region, a channel region and a drain region, which are described in the succeeding illustrations herein below. Perpendicular to the plane of FIGS. 3A-3L, the silicon region 33 has a width of the channel width of the transistor. The silicon region 33 may be undoped, or it might be doped p-type for NMOS transistors or doped n-type for PMOS transistors. Typical maximum doping levels for the silicon 33 are $5\times10^{18}$ ions/cm$^3$ or even slightly higher. Above the silicon region 33, there is a layer of silicon dioxide 371. In a full process flow involving a variety of transistors, this oxide plays various roles. For the purposes of this explanation, it is referred to as a screen oxide. The thickness of this oxide is not critical for the present explanation, but it is assumed to be 3 nm thick, without limiting the scope of the invention. Overlying everything else there is a layer 351 of amorphous (preferably) or polycrystalline silicon. This layer is not to scale in the drawings, because it can range from 50 nm to 150 nm in thickness. Its thickness is not critical to the explanations that follow. These procedures are well known to practitioners of SOI semiconductor fabrication.

Figure 3B:
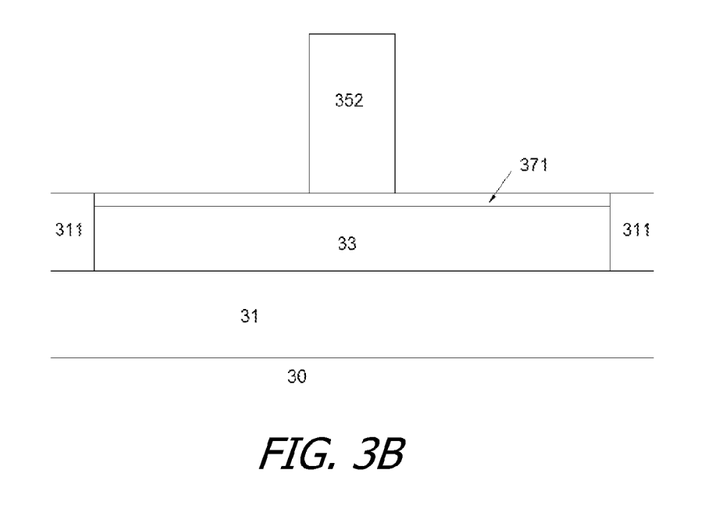

In FIG. 3B the amorphous silicon layer 361 is selectively etched, using standard photo, electron beam or X-ray masking techniques to leave a sacrificial gate structure 352. As viewed in FIG. 3B, the width of element 352 defines the eventual channel length of the thin film transistor. This procedure is well known to practitioners of SOI semiconductor fabrication.

Figure 3C:
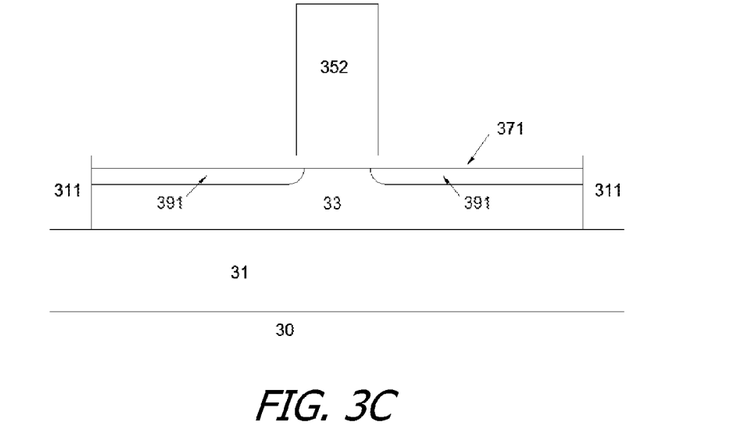

FIG. 3C shows the addition of an ion implantation 391. This implantation is typically known as a drain extension, and it is a very shallow implantation of donors, e.g., phosphorus, arsenic or antimony, for NMOS transistors or acceptors, e.g., boron BF$_2$$^+$ or indium, for PMOS transistors. The dose in this implantation is in an intermediate range, preferably around $1\times10^{14}$ ions/cm$^2$, and its energy is such that it is confined to a layer depth of 5 to 10 nm in the silicon. It should be noted that the implant is localized and excluded from the channel region by the masking effect of the sacrificial gate 352. According to other details of the transistor design, this implant may be accompanied by other implants which are designed to mitigate gate short channel effects in conventional transistors. Besides the local definition by the sacrificial gate, drain extension implants are dedicated to specific classes of transistors by photoresist masking. These procedures are well known to practitioners of SOI semiconductor fabrication.

Figure 3D:
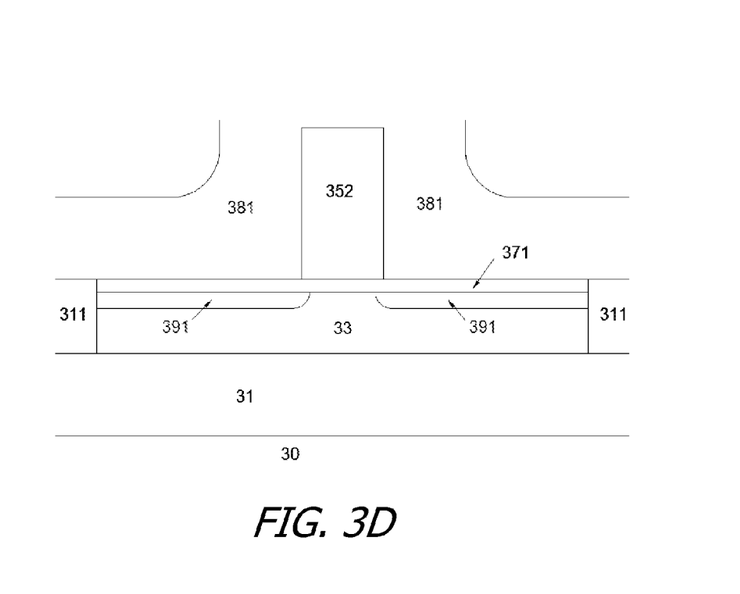

FIG. 3D shows the deposition of dielectric layer 381. This layer is typically silicon nitride, and it may be deposited by either chemical vapor deposition (CVD) or plasma enhanced CVD. The latter process is preferred in order to preclude crystal growth in the sacrificial gate 352. This is the material that provides the spacers 18 and 28 shown in FIG. 1 and FIG. 2 respectively. This thickness of layer 381 will determine in large part the eventual width of the spacers. Typical thicknesses might range from 10 nm to 200 nm. This procedure is well known to practitioners in SOI semiconductor fabrication.

Figure 3E:
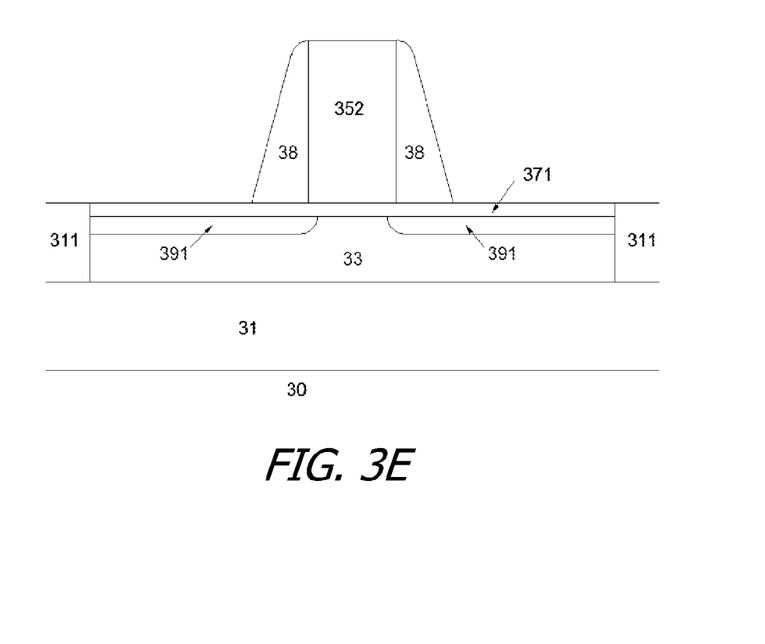

FIG. 3E shows the effect of anisotropic etching of layer 381. Where the surface of layer 381 was flat, the material 381 is cleared, but where it covers a vertical surface, there is a wedge 38 of material left. This is commonly known as a gate spacer. This procedure is well known to practitioners in SOI semiconductor fabrication.

Figure 3F:
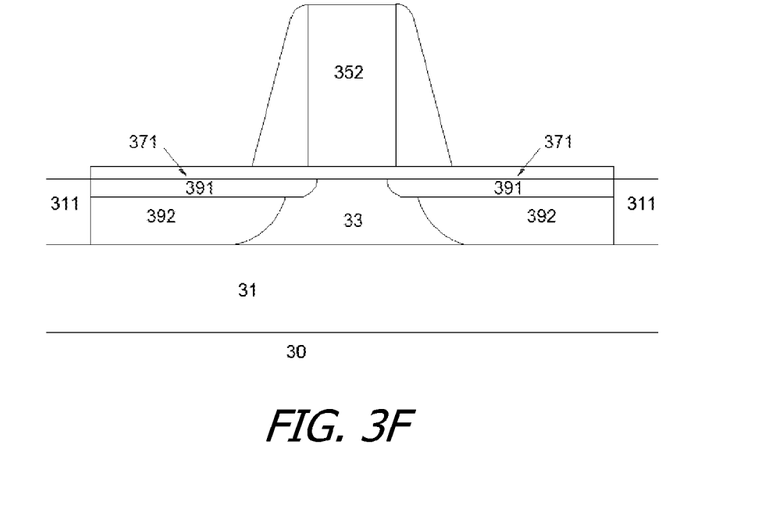

FIG. 3F shows the addition of heavy source and drain implants 392. These implants are typically the heaviest implants in the process flow, and are of the order of $1\times10^{15}$ ions/cm$^2$ or higher. The implants use phosphorus or arsenic for NMOS transistors and boron (sometimes as BF$_2$$^+$) for PMOS transistors. Within each specific transistor, this implant is localized by the masking effect of the spacers 38 and the sacrificial gate 352. The dose and energy of this implant are typically tailored to assure that it reaches through the silicon 33 after activation. After this implant and other related implants are done, they are all activated by one of various rapid thermal annealing processes, e.g., tungsten halogen, xenon flash or laser heating. This procedure is well known to practitioners in SOI semiconductor fabrication.

Figure 3G:
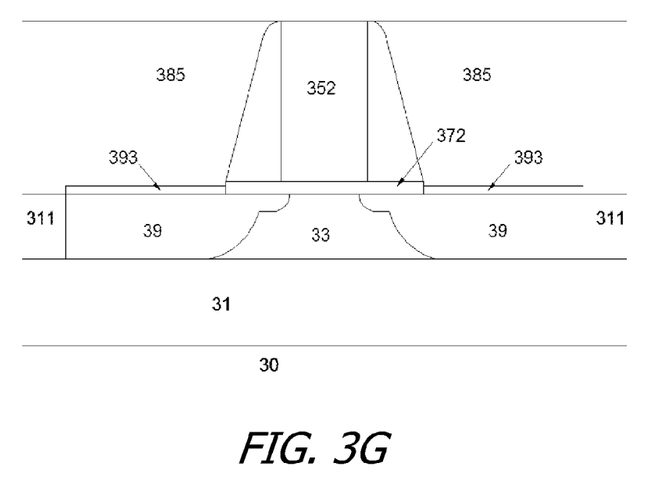

FIG. 3G shows the consequence of several steps. First, the screen oxide 371 is removed by either wet or dry etching except where it is protected by the spacers 38 and the sacrificial gate 352, leaving the remaining piece 372 of the screen oxide. After that a reactive metal, typically nickel is deposited, then heated to form a highly conductive metal-silicide layer 393. This is one typical method of enhancing the conductivity of the sources and drains 39 of the transistors. An alternative procedure, not otherwise illustrated here, involves using epitaxial growth on the surface characterized by label 393 to significantly increase the thickness and conductivity of the thin sources and drains. After the source and drain 39 conductivity enhancement is complete, a dielectric layer 385 is deposited, typically by plasma enhanced CVD. Layer 385 is the first interlayer dielectric. After deposition, layer 385 is planarized by chemical-mechanical polishing (CMP). This exposes the top of the sacrificial gate 352. These procedures are well known to practitioners in SOI semiconductor fabrication.

Figure 3H:
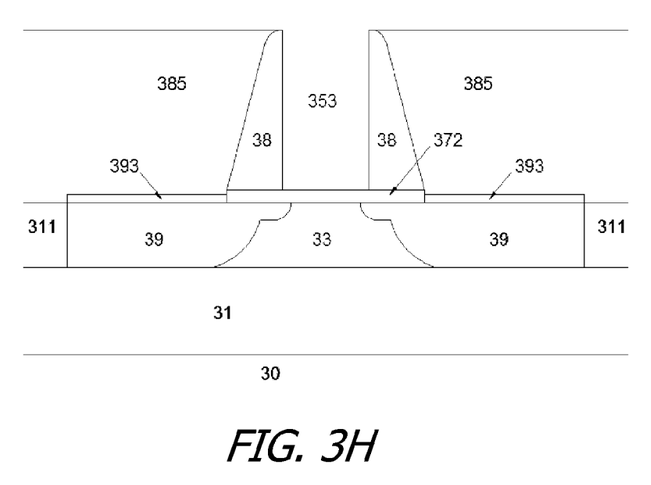

At this stage, as shown by FIG. 3H, the sacrificial gate is selectively etched away, leaving a cavity identified as region 353. This step is commonly used in the class of processes known as "Gate Last" processes.

Figure 3I:
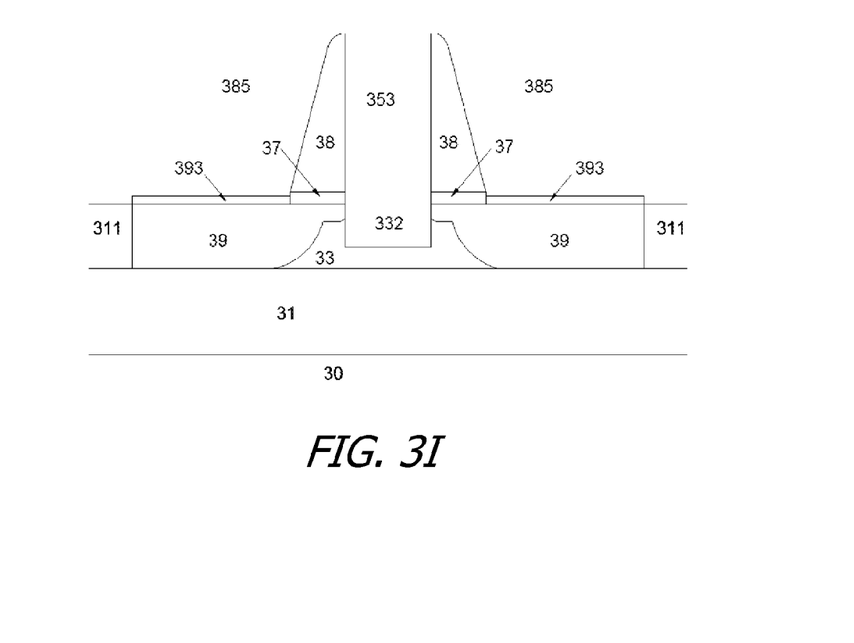

FIG. 3I shows the creation of a recess in accordance with an embodiment. Using the first interlayer dielectric 385 and the spacers 38 as hard masks, the screen oxide 372 is etched through the cavity 353, leaving the residual sections 37 under the spacers 38. This clears the surface of the underlying silicon 33, which is subsequently etched in a controlled fashion to create the recess 332. Both of these etching steps are preferably done with anisotropic processes in order to carry the profile of the spacers 38 into the recess 332. The depth of the recess is part of the overall transistor design, but it can range from 5 nm to 15 nm. This discussion and the drawings assume a depth of 10 nm without limiting the scope of the invention.

Figure 3J:
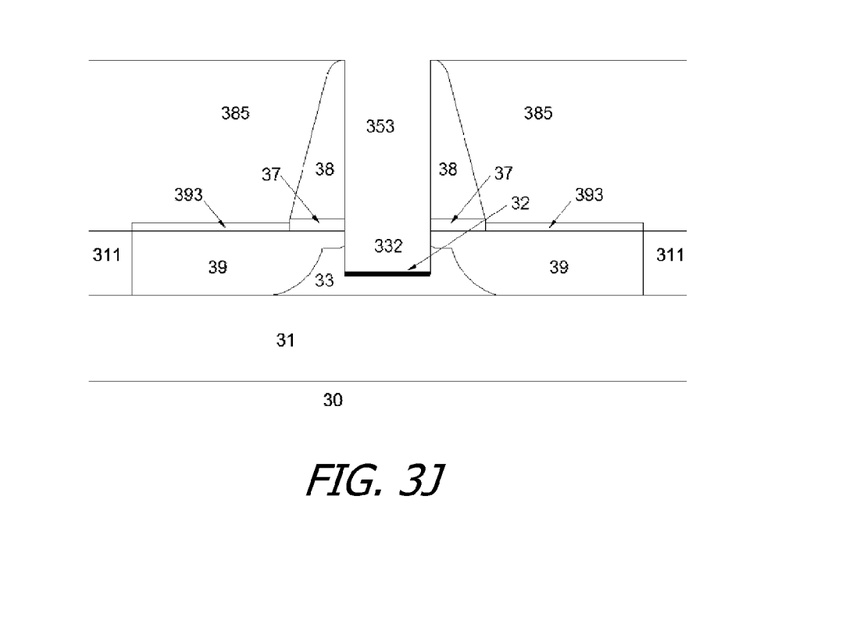

In FIG. 3J, by using a process like molecular beam epitaxy or atomic layer deposition, a very highly doped δ-layer 32 is deposited on the floor of the recess 332. This δ-layer 32 is intended to be extremely thin, for example in the order of 1-3 nm, and it will contain acceptors like boron or indium for NMOS transistor or donors like phosphorus, arsenic or antimony for PMOS transistors. In operation, this layer is fully depleted, meaning that the doping ions act electrically as a layer of charge. The exact amount of charge in the δ-layer 32 is a part of the transistor design because that charge is an important factor in controlling the short channel effects and setting the threshold voltage of the transistor. While a typical value of charge in the δ-layer 32 are $1 \times 10^{13}$ e/cm$^2$ (where e is the magnitude of an electron's charge, about $1.6 \times 10^{-19}$ coulomb), that charge may range from $1 \times 10^{12}$ e/cm$^2$ to $3 \times 10^{13}$ e/cm$^2$. For a 1 nm thick δ-layer 32, those values imply peak doping densities of $1 \times 10^{19}$ ions/cm$^3$ to $3 \times 10^{20}$ ions/cm$^3$. For thicker layers, the peak doping densities are correspondingly less as the important factor in threshold determination is the amount of charge per square centimeter. The doping in the δ-layer 32 is one of: acceptors for an N-type MOSFET and donors for a P-type MOSFET.

Figure 3K:
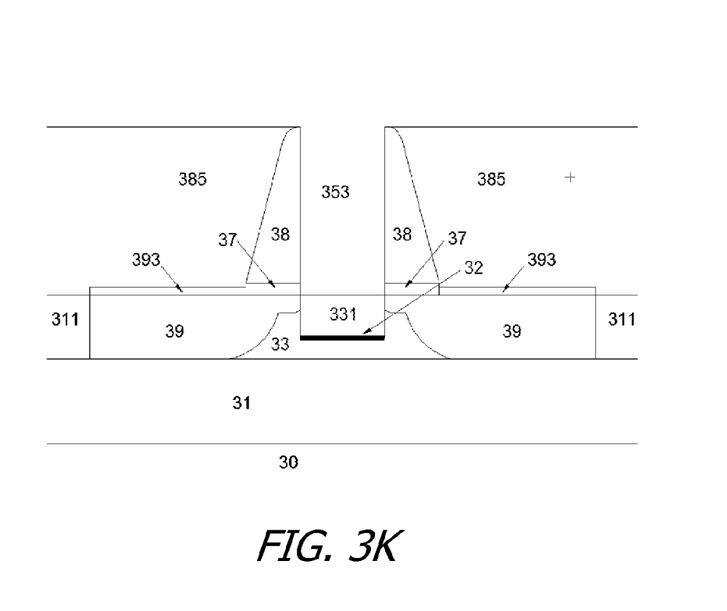

The next step in creating a Channel Last process is shown in FIG. 3K. The recess 332 is refilled by epitaxially growing region 331, which is the channel region. Besides its crystalline integration with the surrounding silicon, there are two other critical factors about this epi region: 1) it must be grown at a very low temperature, preferably not exceeding 650° C.; and, 2) it should have essentially zero doping, certainly not to exceed $1 \times 10^{17}$ ions/cm$^3$. The low temperature epi is important because the efficacy of this structure in reducing threshold voltage fluctuations is greatest when the boundary between high doping and zero doping is perfectly abrupt; high temperature processing softens that interface through thermal diffusion. The low doping in the epi layer is important because each time there is an ionized dopant in that region it causes a deviation of the threshold voltage from its nominal value.

While silicon is the most obvious material from which to epitaxially form region 33, other materials may be used. Silicon:germanium combinations are commonly used in advanced semiconductor devices, and even pure germanium is a possibility. Certain III-V compounds may grow satisfactorily in this small volume. Choice of material should not limit the scope of the invention disclosed herein.

Figure 3L:
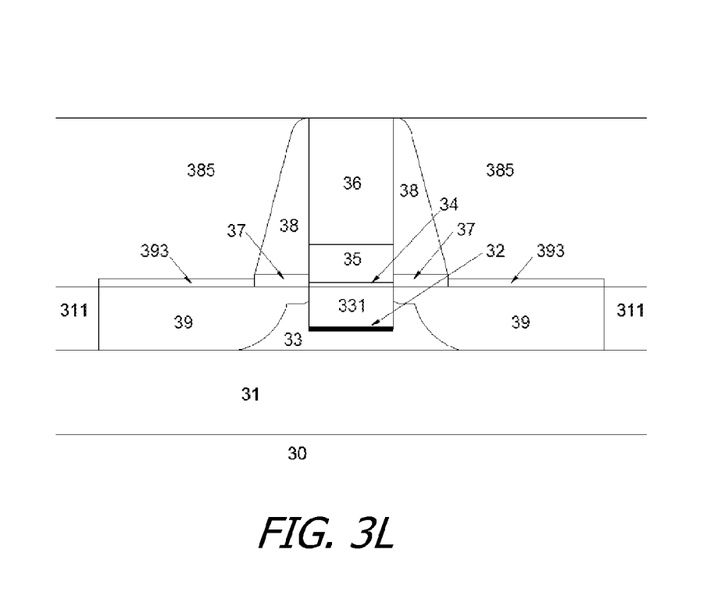

The transistor is completed like any other "Gate Last" transistor as shown in FIG. 3L. A High-K dielectric stack 34 is first deposited over the channel epitaxial layer 331. This stack may have one or more layers, and its effective dielectric constant is typically 6 or more. Its effective oxide thickness, a frequently used measure of electrical thickness, is typically 1 nm or less. Various compounds are employed in the High-K dielectric stack, but most include compounds of hafnium, as HfO$_2$, HfON, HfLaO and others. The next layer in FIG. 3L is a metal gate 35, which is formulated to achieve specific work functions in order to set the threshold voltage of the transistor. This layer is typically between 50 nm and 150 nm thick, and it may consist of one or more layers of metallic materials. One commonly used metallic material is TiN, but hafnium, ruthenium, TaN, MoN and WN also arise as candidates. The final material is a gate handle 36, which is typically amorphous silicon or poly-crystalline silicon. This material protects the underlying metal from chemical or mechanical damage. It also provides electrical connection to the metal gate 35. Once all of layers 34, 35 and 36 are deposited, it is normal to use CMP to restore the planar surface of the first interlayer dielectric 385. All of the steps associated with FIG. 3L are well known to those of ordinary skill in the art.

It is well known that, subsequent to forming the structure shown in FIG. 3L, other steps are necessary to complete the integrated circuit. These include adding a second interlayer dielectric, creating contacts, and adding multiple layers of metal interconnect. Such additional processing steps should not be viewed as departing from the scope of the invention.

Referring back to FIG. 2, it should be recognized that the essential properties of this structure do not depend upon the specific materials used to fabricate the gate dielectric 24 or the gate electrode 25. While the description was written in the context of High-K Metal Gate technology because that is the prevalent materials strategy used in combination with Gate Last processing, other techniques may be used without departing from the scope of the invention. As long as the processing temperatures are kept low, for example but not by way of limitation, below 650° C. and the processing times are kept short, minutes in aggregate, the gate dielectric 24 could be silicon dioxide or silicon oxynitride, and the gate electrode could be amorphous silicon.

Further, still considering FIG. 2, the description hereinabove addresses an ideal case where layer 22 approximates a Dirac δ function in its doping profile, the underlying reason for calling it a δ-layer. However, the principles in this description can be applied by designing the transistor with greater thickness for layer 22, compensating the doping density to realize an appropriate level of charge per unit area and compensating the recess depth and low-doped epi thickness to maintain a charge-free region of several nanometers beneath the gate stack 24. Further, sufficient silicon 23 must be retained to seed good epitaxial growth.

At the other end of the process spectrum, eliminating the δ-layer 22 does not eliminate many of the advantages of this structure, but the threshold voltage is then determined by the charge associated with the underlying silicon film 23, particularly that amount of charge that resides between the bottom of the low doped epi layer 231 and the buried oxide 21. That number typically has a value in the low range, for example a few times $1 \times 10^{12}$ e/cm$^2$.

It will be appreciated that there are a variety of approaches to realizing a structure possessing the essential properties of the "Channel Last" SOI described in the paragraphs hereinabove. The resulting structure has a superior opportunity for threshold definition. For a given threshold voltage, it has a lower magnitude of threshold fluctuation due to random doping variations. Because most of the structure beneath the gate has no doping, it is possible to make the transistor film thicker than a uniformly doped, fully depleted structure. A thicker film means that the mechanical tolerances are somewhat relaxed and that the source and drain structures can have lower resistances. Because the drain edge is defined by the etch that creates a recess in the silicon, wide variations of effective channel length are avoided.

A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to the preferred embodiment, one skilled-in-the-art will readily appreciate that other applications may be substituted for those set forth herein without departing from the spirit and scope of the present invention. Accordingly, the invention should only be limited by the Claims included below.

What is claimed is:

1. A metal-oxide-semiconductor field effect transistor (MOFET) comprising:
    a semiconductor on insulator (SOI) substrate having a semiconductor layer on an insulator layer, which insulator layer is on an underlying substrate;
    a source region and a drain region formed in the semiconductor layer;
    a source extension region extending from the source region towards the drain region, the source extension region having a depth that is less than the depth of the source region;
    a drain extension region extending from the drain region towards the source region, the drain extension region having a depth that is less than the depth of the drain region;
    a semiconductor channel region separating the source extension region and the drain extension region, wherein the semiconductor channel region has a doping ranging from undoped to less than $10^{17}$ doping ions/cm$^3$;
    a doped semiconductor δ-layer of a few atomic layer thickness, having a doping higher than the doping of the channel region at the bottom of the channel region that determines the thickness of the channel region;
    wherein the semiconductor channel region and the semiconductor δ-layer have substantially vertical sides, with the source extension region and the drain extension region each having an edge truncated by the vertical sides of the semiconductor channel region, and
    wherein the semiconductor channel region does not extend through the semiconductor layer to the insulator layer, the thickness of the semiconductor channel region being between 5 nm and 15 nm and is determined to provide a fully depleted channel region during transistor operation, and provide characteristics of an active channel that reduces of the MOSFET;
    a gate dielectric over the channel region;
    a conductive gate region over the gate dielectric;
    whereby statistical variations of a threshold voltage of the MOSFET can be reduced.

2. The MOSFET of claim 1 wherein the δ-layer does not extend through the semiconductor layer to the insulator layer.

3. The MOSFET of claim 2 wherein the source and drain regions extend through the semiconductor layer to the insulator layer.

4. The MOSFET of claim 1 wherein the doping of the δ-layer is one of: acceptors for an N-type MOSFET or donors for a P-type MOSFET.

5. The MOSFET of claim 1, wherein the channel region and the δ-layer are fully depleted at operational voltages of the MOSFET.

6. The MOSFET of claim 1, further comprising a pair of passive spacers above the semiconductor layer, each having substantially vertical faces spaced apart and defining a length of the conductive gate region.

7. The MOSFET of claim 6, wherein the semiconductor channel region fills an etched recess in the semiconductor layer between the spacers.

8. The MOSFET of claim 7 wherein the semiconductor channel region is an epitaxially grown semiconductor region in the etched recess.

9. The MOSFET of claim 1 wherein the gate dielectric is one or more dielectric layers having an effective dielectric constant greater than 6.

10. The MOFET of claim 9 wherein the conductive gate region is a metal gate region.

11. A metal-oxide-semiconductor field effect transistor (MOSFET) comprising:
    a semiconductor on insulator (SOI) substrate having a silicon layer on a dielectric insulator layer, wherein the dielectric insulator layer is on an underlying substrate;
    a source region and a drain region extending through the silicon layer to the dielectric insulator layer;
    a source extension region extending from the source region towards the drain region, the source extension region having a depth that is less than the depth of the source region;
    a drain extension region extending from the source region towards the source region, the drain extension region having a depth that is less than the depth of the drain region;
    an epitaxially grown semiconductor channel region truncating an edge of the source extension region and an edge of the drain extension region, the semiconductor channel region having a doping ranging from undoped to less than $10^{17}$ doping ions/cm$^3$, wherein the semiconductor channel region has substantially vertical sides, with the source extension region and the drain extension region each having an edge truncated by the vertical sides of the semiconductor channel region, wherein the channel region has a thickness determined by a doped semiconductor δ-layer of a few atomic layer thickness, having a doping higher than the doping of the channel region, at the bottom of the channel region, the width of the semiconductor δ-layer being substantially limited by the vertical sides of the channel region, and wherein the semiconductor channel region has a thickness of between 5 nm and 15 nm and the semiconductor channel region does not extend through the doped semiconductor δ-layer, and the semiconductor layer to the dielectric insulator layer, the depth of the semiconductor channel region being determined to provide an active channel of the transistor having required characteristics;
    a gate dielectric over the channel region;
    a conductive gate region over the gate dielectric;
    whereby statistical variations of a threshold voltage of the MOSFET can be reduced.

12. The MOSFET of claim 11 wherein the semiconductor δ-layer also does not extend through the semiconductor layer to the dielectric insulator layer.

13. The MOSFET of claim 11 wherein the doping in the δ-layer is one of: acceptors for an N-type MOSFET and donors for a P-type MOSFET.

14. The MOSFET of claim 11, wherein the δ-layer is fully depleted at operational voltages of the MOSFET.

15. The MOSFET of claim 11, further comprising a pair of passive spacers above the semiconductor layer, each having substantially vertical faces spaced apart and defining a length of the conductive gate region.

16. The MOSFET of claim 15, wherein the semiconductor channel region fills an etched recess in the semiconductor layer between the spacers.

17. The MOSFET of claim 15 wherein the semiconductor channel region and the δ-layer fill an etched recess in the semiconductor layer between the spacers.

* * * * *